(12) United States Patent
Chen et al.

(10) Patent No.: US 10,217,947 B2
(45) Date of Patent: Feb. 26, 2019

(54) ORGANIC COMPOUND AND ELECTRONIC DEVICE USING SAME

(71) Applicant: Nichem Fine Technology Co., Ltd., Hsinchu County (TW)

(72) Inventors: Chien-Tien Chen, Hsinchu County (TW); Chi-Chung Chen, Hsinchu County (TW)

(73) Assignee: NICHEM FINE TECHNOLOGY CO., LTD., Hsinchu County (TW)

( * ) Notice: Subject to any disclaimer, the term of this patent is extended or adjusted under 35 U.S.C. 154(b) by 127 days.

(21) Appl. No.: 15/227,985

(22) Filed: Aug. 4, 2016

(65) Prior Publication Data
US 2018/0040830 A1   Feb. 8, 2018

Related U.S. Application Data

(60) Provisional application No. 62/200,929, filed on Aug. 4, 2015.

(51) Int. Cl.
| | |
|---|---|
| *H01L 51/54* | (2006.01) |
| *C09K 11/06* | (2006.01) |
| *H01L 51/00* | (2006.01) |
| *C09K 11/02* | (2006.01) |
| *H01L 51/50* | (2006.01) |

(52) U.S. Cl.
CPC ........ *H01L 51/0072* (2013.01); *C09K 11/025* (2013.01); *C09K 11/06* (2013.01); *H01L 51/0052* (2013.01); *C09K 2211/1007* (2013.01); *C09K 2211/1011* (2013.01); *C09K 2211/1014* (2013.01); *C09K 2211/1044* (2013.01); *H01L 51/5012* (2013.01); *H01L 51/5056* (2013.01)

(58) Field of Classification Search
CPC .. C07D 235/00; C07D 235/02; C07D 235/20; C07D 209/86; C07D 213/00; C07D 213/02; C07D 213/06; C07D 401/00; C07D 401/14; C07D 403/00; C07D 403/14; C07D 251/00; C07D 251/24; C07D 471/00; C07D 471/04; C07D 471/10; C07D 487/00; C07D 487/04; C07D 487/10; C07D 211/58; C07C 255/52; C07C 2603/32; C09K 11/025; C09K 11/06; C09K 2211/00; C09K 2211/10; C09K 2211/1007; C09K 2211/1011; C09K 2211/1014; C09K 2211/1029; C09K 2211/1044; C09D 2211/00; C09D 2211/10; C09D 2211/1007; C09D 2211/1011; C09D 2211/1014; C09D 2211/1029; C09D 2211/1044; Y02E 10/549; C07F 5/027; C07F 9/5329; H01L 51/0032; H01L 51/005; H01L 51/0051; H01L 51/0052; H01L 51/0056; H01L 51/0059; H01L 51/0061; H01L 51/0062; H01L 51/0067; H01L 51/0071; H01L 51/0072; H01L 51/0073; H01L 51/0074; H01L 51/0095; H01L 51/44; H01L 51/424; H01L 51/50; H01L 51/5012; H01L 51/5016; H01L 51/5056; H01L 51/5072; H01L 51/5096
USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

2003/0108770 A1\*  6/2003  Hamada .............. H01L 51/5096
                                                                  428/690

FOREIGN PATENT DOCUMENTS

CN          103936720 A   \*   7/2014

OTHER PUBLICATIONS

Machine translation of CN103936720. (Year: 2014).\*
Chen et al. J. Am. Chem. Soc. 2006, 128, 10992-10993. (Year: 2006).\*

\* cited by examiner

*Primary Examiner* — Andrew K Bohaty
(74) *Attorney, Agent, or Firm* — The PL Law Group, PLLC

(57) ABSTRACT

An organic compound is disclosed. The organic compound includes a cis-stilbene segment, a bridge atom segment having a bridge atom with four bonds, and the bridge atom is connected to the cis-stilbene segment with two of the four bonds to form a 7-membered ring structure, and an imidazole segment connected to the cis-stilbene segment.

20 Claims, 2 Drawing Sheets

100

200

ORGANIC COMPOUND AND ELECTRONIC DEVICE USING SAME

CROSS-REFERENCE TO RELATED APPLICATION AND CLAIM OF PRIORITY

The application claims the benefit of the U.S. Provisional Patent Application No. 62/200,929, filed on Aug. 4, 2015, at the U.S. Intellectual Property Office, the disclosures of which are incorporated herein in their entirety by reference.

FIELD OF THE INVENTION

The present invention relates to an organic compound. In particular, the present invention is related to an organic compound for use in an electronic device.

BACKGROUND OF THE INVENTION

It is well known that the organic light emitting diode (OLED) was initially invented and proposed by the Eastman Kodak Company through a vacuum evaporation method. Tang and VanSlyke of the Kodak Company deposited an electron transport material such as Alq3 on a transparent indium tin oxide (abbreviated as ITO) glass formed with an organic layer of aromatic diamine thereon, and subsequently completed the fabrication of an organic electroluminescent (EL) device after a metal electrode was vapor-deposited onto the Alq3 layer. The organic EL device has become a new generation lighting device or display because of high brightness, fast response speed, light weight, compactness, true color, no difference in viewing angles, the lack of any LCD backlight plates, and low power consumption.

Recently, some interlayers such as an electron transport layer and a hole transport layer has been added between the cathode and the anode to increase the current efficiency and power efficiency of the OLEDs. For example, an OLED 100 shown as FIG. 1 includes a cathode 11, an electron injection layer 12, a light emitting layer 15, a hole transport layer 17, and an anode 18.

In the device function concept, the light emitted by the OLED 100 results from excitons produced by the recombination of electrons and holes in the light emitting layer 14. However, according to theoretical speculation, the ratio of the excitons with a singlet excited state and the excitons with a triplet excited state is 3:1. So, when a small molecular fluorescent material is used as the light-emitting layer 14 of the OLED 100, about 25% of the excitons are used to emit light, and the other 75% of the excitons in the triplet excited state are lost through a non-luminescence mechanism. For this reason, the general fluorescent material performs at a maximum quantum yield of 25%, a limit which amounts to an external quantum efficiency of 5% in the device.

Moreover, researchers further found that certain hole transport type materials can simultaneously perform electron confining, such as materials represented by the following Formulas 1' and 2'. Formula 1' represents the chemical structure of tris(4-carbazoyl-9-ylphenyl)amine, which is abbreviated TCTA. Formula 2 represents the chemical structure of N,N'-di(1-naphthyl)-N,N'-diphenyl-(1,1'-biphenyl)-4,4'-diamine abbreviated NPB.

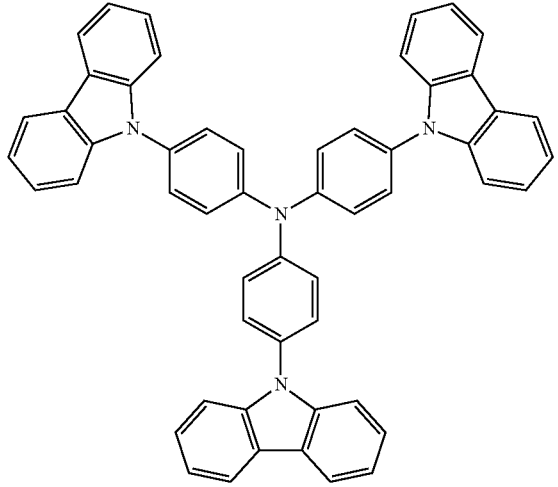

[Formula 1']

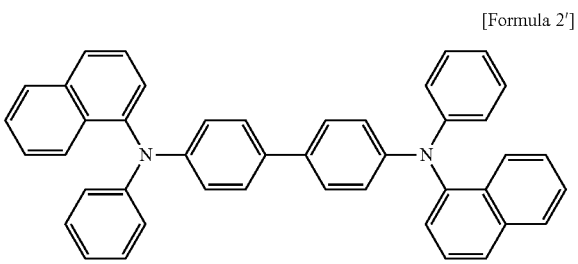

[Formula 2']

In addition, for effective blue-emitting performance in OLED applications, researchers have developed hole-transporting type, blue-emitters based on triarylamine dimer regimes, such as IDE-102, N-STIF-N developed in my laboratory, and spirobifluorene-based systems. These materials are represented by the following Formulas 3', 4', and 5'.

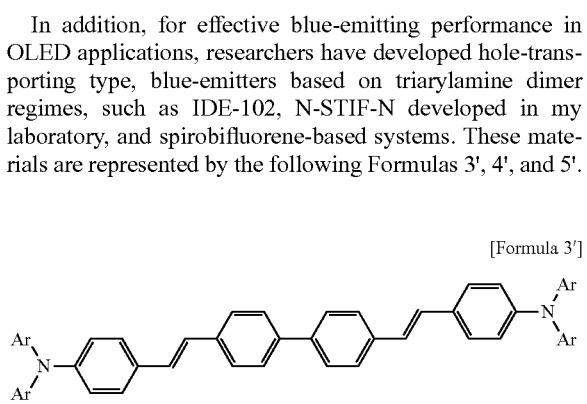

[Formula 3']

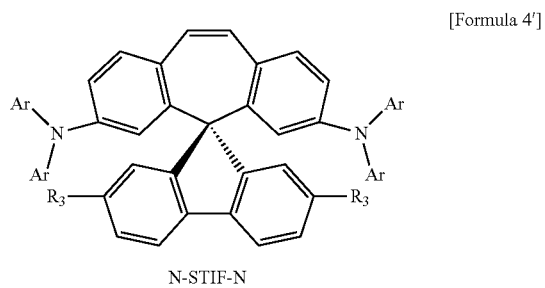

[Formula 4']

N-STIF-N

[Formula 5']

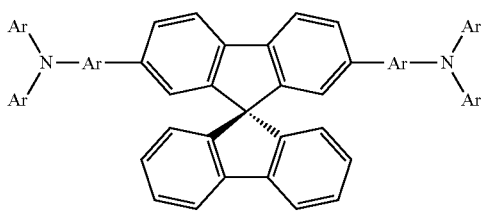

Recently, to effectively increase the light emitting performance of OLEDs, OLED manufactures and researchers have made great efforts to develop electron transport materials with hole blocking functionality, such as TmPyPb, TPBi, 3TPYMB, BmPyPb, and DPyPA represented by following Formula 6'-10', respectively. TmPyPb is the abbreviation of 3,3'-[5'-[3-(3-Pyridinyl)phenyl][1,1':3',1''-terphenyl]-3,3''-diyl]bispyridine, TPBi is the abbreviation of 1,3,5-Tris(1-phenyl-1H-benzimidazol-2-yl)benzene, 3TPYMB is the abbreviation of tris(2,4,6-triMethyl-3-(pyridin-3-yl)phenyl)borane, BmPyPb is the abbreviation of 1,3-bis(3,5-dipyrid-3-yl-phenyl)benzene, and DPyPA is the abbreviation of 9,10-bis(3-(pyridin-3-yl)phenyl) anthracene.

[Formula 6']

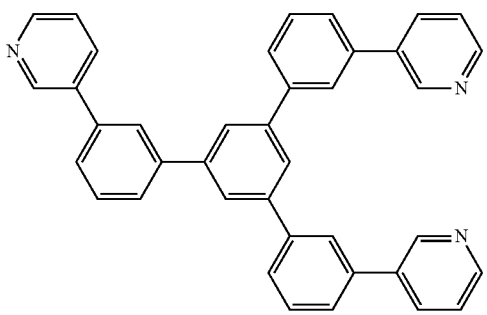

[Formula 7']

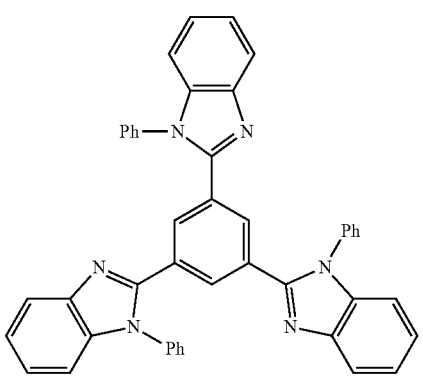

[Formula 8']

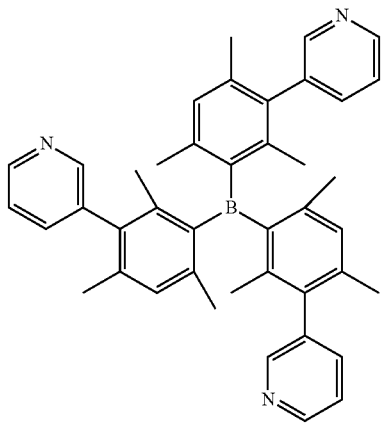

[Formula 9']

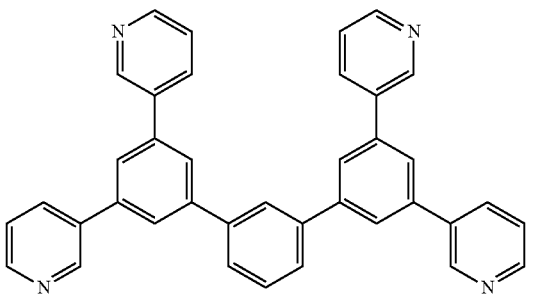

[Formula 10']

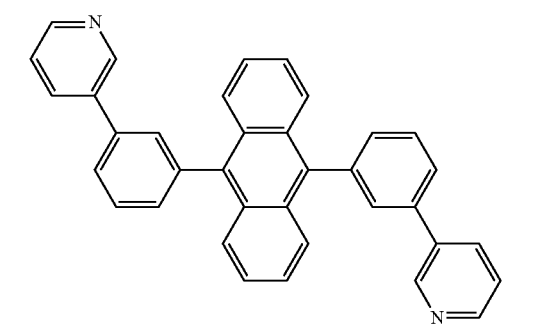

In spite of various blue emitting dopant materials and emitters with electron blocking functionality having been developed, the fluorescent OLEDs that use these blue dopant materials still cannot perform outstanding luminous efficiency with a long device lifetime. Accordingly, because the conventional or commercial blue emitting dopant materials and emitters with electron blocking and triplet-triplet annihilation (TTA) functionality still include drawbacks, the inventor of the present application has made great efforts to make inventive research and eventually discovered a series of imidazole-fused, spirally configured cis-stilbene/fluorene hybrid materials that can be used as blue dopant emitters and emitters for OLEDs.

SUMMARY OF THE INVENTION

In accordance with one aspect of the present invention, an organic compound is disclosed. The organic compound includes a cis-stilbene segment, a bridge atom segment having a bridge atom with four bonds, and the bridge atom is connected to the cis-stilbene segment with two of the four bonds to form a 7-membered ring structure, and an imidazole segment connected to the cis-stilbene segment.

In accordance with another aspect of the present invention, an electronic device made using a compound is disclosed. The electronic device includes a cis-stilbene segment, a bridge atom segment having a bridge atom with four bonds, and the bridge atom is connected to the cis-stilbene segment with two of the four bonds to form a 7-membered ring structure, and an imidazole segment connected to the cis-stilbene segment.

The above objectives and advantages of the present invention will become more readily apparent to those ordinarily skilled in the art after reviewing the following detailed descriptions and accompanying drawings.

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; they are not intended to be exhaustive or to be limited to the precise form disclosed.

Figure 1:
FIG. 1 is an OLED structure according to prior art.
Figure 2:
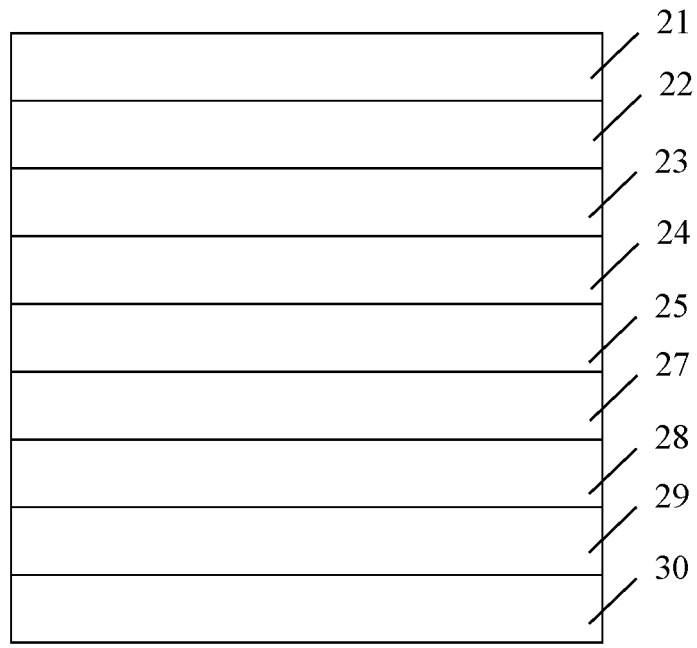
FIG. 2 is an OLED structure according to one embodiment of the present invention.
Figure 3:
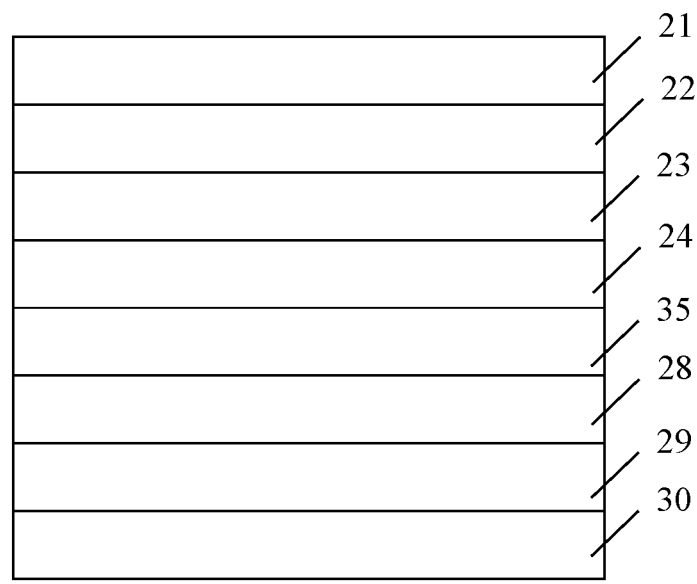
FIG. 3 is an OLED structure according to another embodiment of the present invention.

The present invention discloses an organic compound, which includes at least one of a series of imidazole-fused spirally configured cis-stilbene/fluorine compound and its derivatives. The compound includes a cis-stilbene segment, a bridge atom segment having a bridge atom with four bonds, and the bridge atom is connected to the cis-stilbene segment with two of the four bonds to form a 7-membered ring structure, and each of the other two of the four bonds is connected to one of methyl and phenyl; and an imidazole segment connected to the cis-stilbene segment. The compound or its derivatives have the light-emitting property and function as hole transport materials. Therefore, the compound or its derivatives can be applied in electronic devices such as fluorescent OLEDs as a host material for the light emitting layer, a dopant for the light emitting layer, or a hole-transport type emitting layer. A structure of an OLED 200 of an embodiment of the present invention is shown in FIG. 2, which consecutively includes a cathode 21, an electron injecting layer 22, an electron transport layer 23, an hole blocking layer 24, a light emitting layer 25 including the host material and the dopant, a hole transport layer 27, a hole injecting layer 28, an anode 29, and a substrate 30. When the hole transport layer 27 and the light emitting layer 25 can be formed as a single layer 35, as shown in an OLED 300 in FIG. 3, the single layer 35 is a hole transport type emitting layer made of the compound or its derivatives.

Each of the electronic devices mentioned above can be applied to any device or apparatus having a display, such as one selected from a group consisting of an organic light emitting apparatus, a solar cell apparatus, an organic transistor, a detection apparatus, a computer monitor, a TV, a billboard, a light for interior or exterior illumination, a signaling light for interior or exterior illumination, a flexible display, a laser printer, a telephone, a cell phone, a remote control apparatus, a pad computer, a laptop computer, a digital camera, a camcorder, a viewfinder, a micro-display, a vehicle electronic apparatus, a large area wall display, a theater screen, a stadium screen, a signaling apparatus, a personal digital assistant (PDA), a laptop computer, an industrial computer, a point of sales (POS), a heads-up display, a fully transparent display, and a touch display.

According to one embodiment of the present invention, the imidazole segment in the organic compound has an aromatic group substituting a hydrogen connecting with one of a nitrogen and a carbon on the imidazole segment, wherein the aromatic group is a phenyl group. When each of the hydrogen connecting to the nitrogen and the hydrogen connecting to the carbon on the imidazole segment is substituted with the phenyl group, the imidazole segment is a 1,2-diphenyl imidazole segment, and the 1,2-diphenyl imidazole segment is represented by Formula 1a.

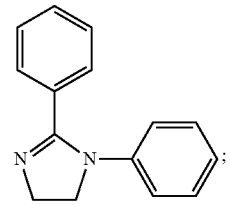

Formula 1a

When the hydrogen connecting to the carbon on the imidazole segment is substituted with the phenyl group, the imidazole segment is a 2-phenyl imidazole segment, and the 2-phenyl imidazole segment is represented by Formula 1b.

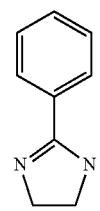

Formula 1b

When the hydrogen connecting to the nitrogen on the imidazole segment is substituted with the phenyl group, the imidazole segment is a 1-phenyl imidazole segment, and the 1-phenyl imidazole segment is represented by Formula 1c.

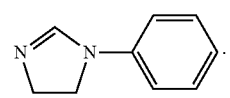

Formula 1c

According to one embodiment of the present invention, the cis-stilbene segment in the organic compound is represented by Formula 2:

Formula 2

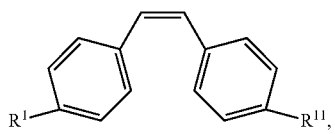

wherein each of $R^1$ and $R^{11}$ is one selected from a group consisting of H, halogen —Ar, —CN, —CF$_3$, —Ar—F, an aromatic amino group, Formulae 3a and 3b:

Formula 3a

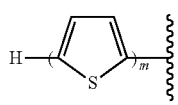

Formula 3b

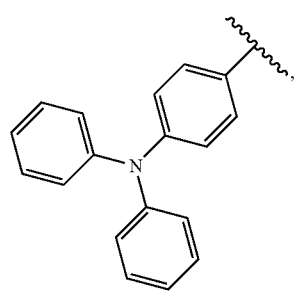

and wherein the halogen is one selected from a group consisting of F, Cl, Br and I, either of Ar and G is phenyl, the aromatic amino group is —NR$^4$R$^5$, wherein either of R$^4$ and R$^5$ is one selected from a group consisting of H and phenyl and naphthyl, and in is an integer of 1-3, and —NR$^4$R$^5$ is represented by one Formulae 3m, 3n and 3p:

Formula 3m

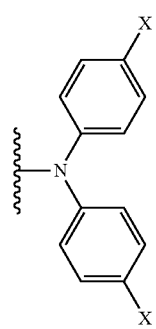

Formula 3n

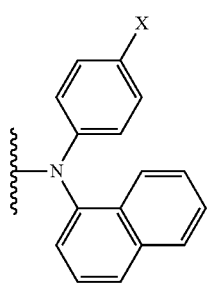

Formula 3p

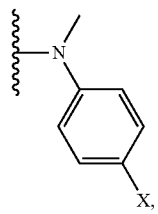

wherein X is one of H and a substituted or un substituted alkyl having 1 to 20 carbon atoms.

According to one embodiment of the present invention, the bridge atom is one of carbon and silicon, and the bridge atom segment is one selected from a group consisting of Formulae A1, A2, A3 and A4:

Formula A1

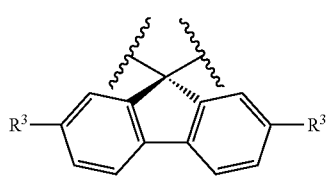

Formula A2

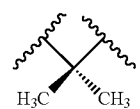

Formula A3

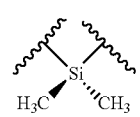

Formula A4

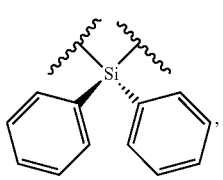

wherein R$^3$ is one selected from a group consisting of H, tert-butyl and naphthyl.

Embodiment 1

According to the first embodiment of the present invention, when each of the hydrogen connected to the first nitrogen position in the imidazole segment and the hydrogen connected to the second carbon position in the imidazole segment is substituted by phenyl and forms 1,2-diphenyl imidazole segment represented by Formula 1b, the organic compound is one of the 1,2-diphenylimidazole-fused, spirally-configured cis-stilbene/fluorene derivatives, and is represented by the following Formula 4A:

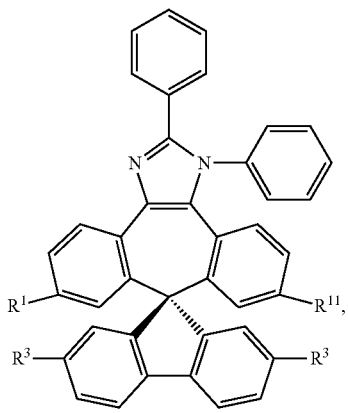

Formula 4A wherein $R^1$, $R^3$, and $R^{11}$ are the same as those previously described.

Embodiment 2

According to the second embodiment of the present invention, when the hydrogen connected to the second carbon position in the imidazole segment is substituted by phenyl and forms 2-phenyl imidazole segment represented by Formula 1b, the organic compound is one of the 2-phenylimidazole-fused, spirally-configured cis-stilbene/fluorene derivatives, and is represented by the following Formula 4B:

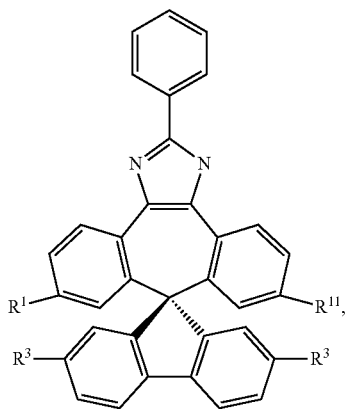

Formula 4B wherein $R^1$, $R^3$, and $R^{11}$ are the same as those previously described.

Embodiment 3

According to the third embodiment of the present invention, when the hydrogen connected to the first nitrogen position in the imidazole segment is substituted by phenyl and forms 1-phenyl imidazole segment represented by Formula 1c, the organic compound is one of the 1-phenylimidazole-fused, spirally-configured cis-stilbene/fluorene derivatives, and is represented by the following Formula 4C:

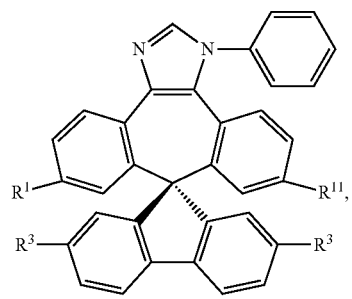

Formula 4C wherein $R^1$, $R^3$, and $R^{11}$ are the same as those previously described.

Embodiment 4

According to the first embodiment of the present invention, when the imidazole segment is represented by Formula 1a and $R^1$ and $R^{11}$ are the same, each of which is represented by R, the organic compound is one of the 1,2-diphenylimidazole-fused, spirally-configured cis-stilbene/fluorene derivatives, and is represented by the following Formula 4D:

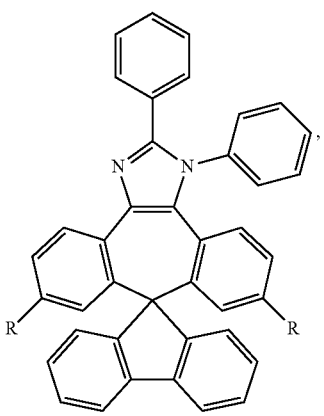

Formula 4D wherein R is $R^1$ and is the same as those previously described.

Synthesis of the Organic Compound

The synthesis method of the organic compound represented by Formula 5 includes the following steps.

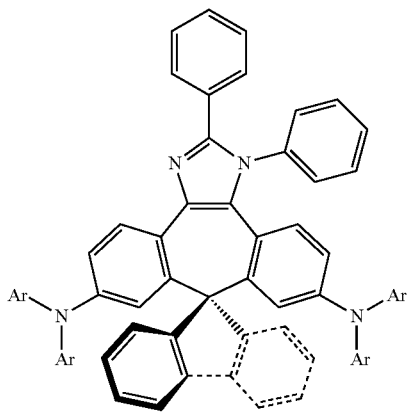

Formula 5

Step 1:

Consecutively add 5505.9 mg (equivalent to 10.7 mmol) of Compound 11 represented by Formula 11, 15 ml of acetic acid and 1.5 ml of concentrated hydrochloric acid into a reaction flask to form a solution. The color of the solution in the reaction flask will change to red. Install a reflux tube to the top of the reacting bottle. Put the reaction flask in an oil bath, at a temperature of about 120° C. After reacting for 30 minutes, the red color of the solution will fade and many precipitates will occur. The reaction flask is then lifted out of the oil bath and cooled down. Take off the reflux tube and use N-hexane to flush out the remaining silicon oil from the residue on the bottom. The residue on the bottom of the reaction flask is extracted using dichloromethane three times, each time with 50 ml, and water. The obtained organic extract solution is dried by adding magnesium sulfate, filtered, and then dried using rotary evaporation to withdraw the solvents to obtain a raw product. The raw product is purified by column chromatography using dichloromethane and water in a ratio of 1:3, and then further purified by recrystallization using dichloromethane and water, to obtain 4985.3 mg of solid Compound 12 represented by Formula 12, which is 3,7-dibromo-5,5-spirofluorenyl-5H-dibenzo[a,d]cycloheptene. Yield is 91%.

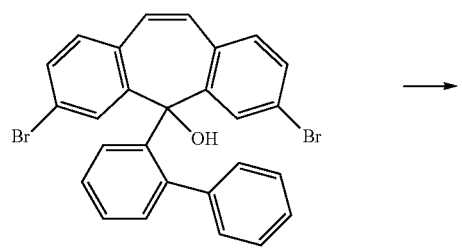

Formula 11

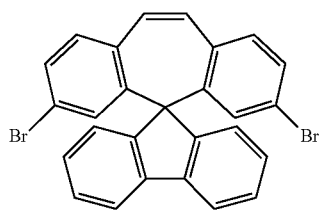

Formula 12

Step 2:

Add 2489.89 mg (5 mmol) of Compound 12, 2340.8 mg (6.5 mmol) of benzeneseleninic anhydride (BSA) and 20 ml of chlorobenzene to a reaction flask with a reflux tube thereon in an oil bath to react for 18 hours. Thin layer chromatography (TLC) is then used to confirm that no reactants exist. The reaction flask is lifted out of the oil bath and cooled down. Take off the reflux tube and use N-hexane to flush out the remaining silicon oil from the residue on the bottom. Rotary evaporation is used to evaporate the chlorobenzene from the residue. A suction funnel with 2 cm thick silicone gel and filters therein is used to filter and obtain the solid filtrate, which is further flushed with N-hexane several times. The solid filtrate is purified by recrystallization using dichloromethane and N-hexane to obtain 2164.5 mg of Compound 13, which is represented by Formula 13. Yield is 82%. The by-product, diphenylselenide, can be recycled at the same time.

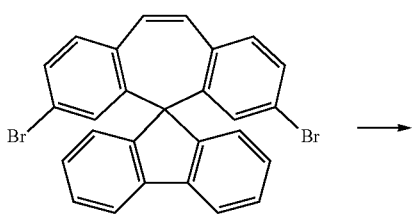

Formula 12

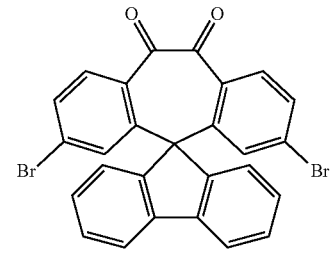

Formula 13

Step 3:

A 100 ml two-necked round-bottomed flask, as a reaction flask, with a stirrer therein, and equipped with a reflux tube is used. After the reaction flask is dried using a vacuum system, and then filled with nitrogen gas, 1594 mg (3 mmol) of Compound 13, 815.1 mg (4.5 mmol) of Compound 14 and 3004.9 mg (39 mmol) of ammonium acetate (NH$_4$OAc), as well as 15 ml acetic acid, are added to the reaction flask. All the ingredients in the reaction flask are uniformly stirred with a magnetic stirrer. The reaction flask is placed in an oil bath, at a temperature of about 70° C., and the ingredients react for 30 hours. TLC is then used to confirm that no reactants exist. The reaction flask is lifted out of the oil bath and cooled down. Take off the reflux tube and use N-hexane to flush out the remaining silicon oil from the residue on the bottom. The residue on the bottom of the reaction flask is extracted using dichloromethane three times, each time with 50 ml, and water. The obtained extract solution is dried by adding magnesium sulfate, filtered, and then dried by rotary evaporation to withdraw the solvents to obtain a raw product. The raw product is purified using column chromatography with ethyl acetate and N-hexane in a ratio of 1:8, and then further purified by recrystallization using dichloromethane and water, to obtain 1655 mg of solid Compound 10 represented by Formula 10, which is sprio-fluorene-3,7-dibromo-dibenzosuberene[d]imidazole. Yield is 80%.

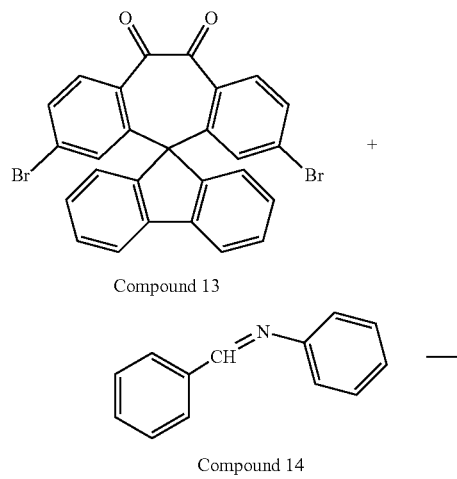

Compound 13

Compound 14

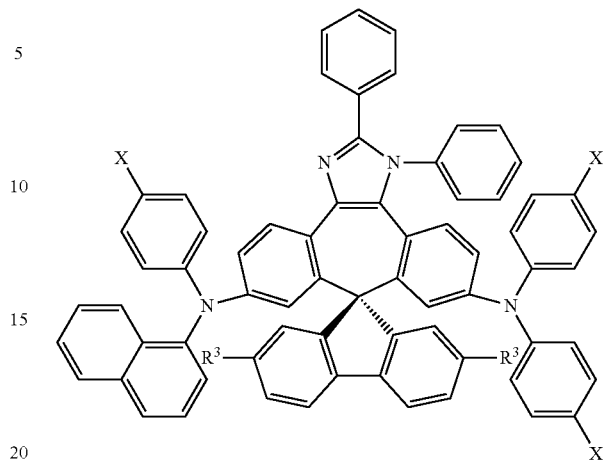

Formula 16

Formula 17 wherein $R^3$ can be H, tert-butyl ornaphthyl, and X can be H or a substituted or unsubstituted alkyl having 1 to 20 carbon atoms.

Compound 10

The other imidazole-fused, spirally-configured cis-stilbene/fluorene derivatives, such as Compounds 15~17 represented by Formulae 15~17, can be obtained using the processes described below, such as a coupling reaction, to those described above. A skilled person in the art knows that similar derivatives and their manufacturing methods are within the scope of the present invention.

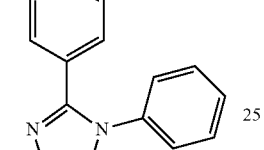

Formula 15

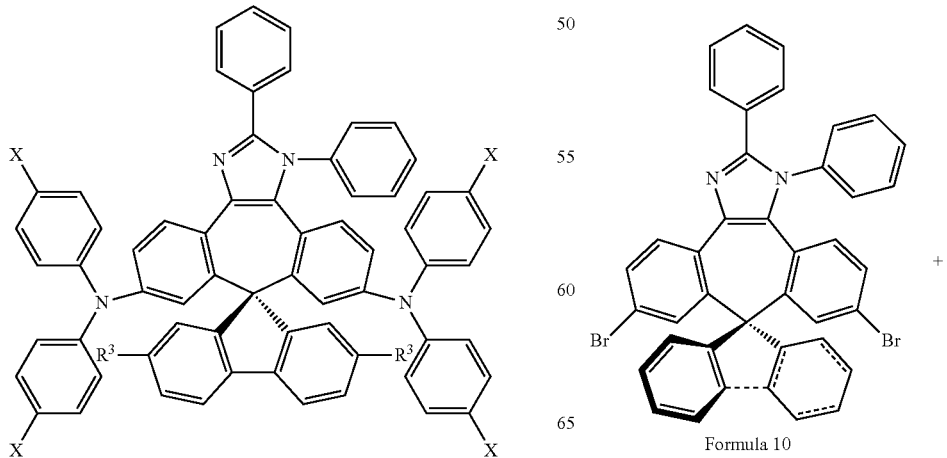

Formula 10

-continued

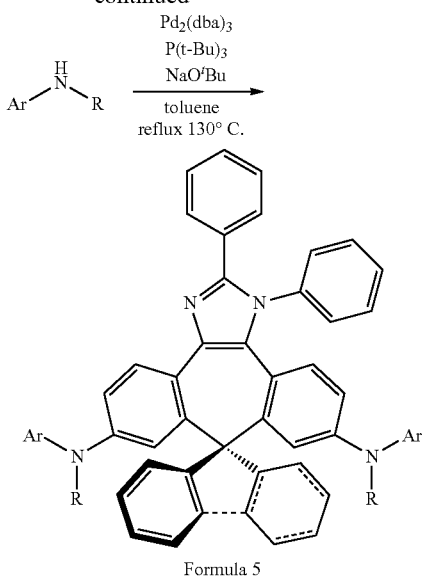

Formula 5

Formula 5 is a general formula representing Compounds 15-17, each of which has a substituent —NArR being one of Formulae 3m-3p. When the substituent —NArR is represented by Formula 3m, the organic compound is Compound 15. The synthesis method of Compound 15 includes the following steps.

First, 4870.8 mg (7 mmol) of Compound 10 (99%), 192 mg (1.5 mmol) of Pd$_2$(dba)$_3$, 4035 mg (60 mmol) of sodium tert-butoxide, 1 ml of tri-t-butylphosphone, and 2960 mg, (17.5 mmol) of diphenylamine are dissolved in 70 ml of toluene under nitrogen atmosphere, followed by refluxing the obtained mixture for 4 to 8 hours. Then, the mixture is quenched with 100 ml of water, and the aqueous layer was separated and extracted with dichloromethane three times, each time with 200 ml. The combined organic layers are dried using magnesium sulfate, filtered, and evaporated. The obtained crude solid was re-crystallized using dichloromethane and n-hexane in a ratio of 1:1 to obtain 5030 mg (83%) of Compound 15. Using the similar synthesis method, Compounds 16 and 17 are obtained likewise.

Data for the obtained Compound 15 are shown as follows: T$_m$ 311° C. (DSC); M.W.: 869.06; $^1$H NMR (500 MHz, CDCl$_3$) δ 7.59 (d, J=7.5, 2H), 7.51 (s, 2H), 7.36-7.29 (m, 6H), 7.16-7.13 (m, 14H), 6.9-6.8 (m 15H), 6.70 (s, 3H), 6.55 (s, 2H); $^{13}$C NMR (100 MHz, CDCl$_3$) δ 149.47, 147.76, 147.50, 146.99, 146.70, 143.21, 142.26, 140.03, 139.47, 137.61, 131.09, 130.84, 129.47, 129.40, 129.08, 128.98, 128.75, 128.44, 128.30, 128.15, 128.01, 127.44, 126.98, 124.94, 124.50, 124.38, 123.20, 123.10, 122.59, 122.37, 121.66, 119.71, 119.11, 66.35, 53.38; MS (20 eV) 869.4 (M$^+$, 100), 870.4 (66), 871.4 (21), 1736.7 (11), 1737.7 (15), 1738.7 (9); IR (KBr) 3057 (m), 1588 (s), 1488 (s), 1445 (s), 1399 (s), 1373 (s), 1278 (s), 1155 (s), 1074 (s), 1027 (s); HR-MS calcd for C$_{64}$H$_{44}$N$_4$: 869.0610, found: 869.0618; Anal. Calcd for C$_{64}$H$_{44}$N$_4$: C, 88.45, H, 5.10, N, 6.45. found: C, 88.57, H, 5.12, N, 6.42; TLC R$_f$ 0.28 (CH$_2$Cl$_2$/hexane, 1/1).

Data for the obtained Compound 16 are shown as follows: m.p. 317.6° C. (DSC); M.W.: 696.18; $^1$H NMR (400 MHz, CDCl$_3$) δ 8.24 (d, J=8.2, 1H), 7.89 (d, J=8.2, 2H), 7.72 (d, J=7.1, 4H), 7.80 (d, J=7.9, 2H), 7.57 (d, J=8.4, 1H), 7.48 (m, 4H), 7.4 (d, J=7.6, 2H), 7.3 (m, 4H), 7.28 (s, 2H), 7.24 (m, 2H), 7.20 (s, 1H), 7.18 (s, 1H) 7.09 (m, 5H), 7.03 (d, J=8.3, 2H), 6.98 (t, J=7.5, 3H), 6.91 (d, J=7.9, 3H), 6.86 (d, J=8.0, 2H), 6.80 (d, J=7.8, 2H), 6.53 (s, 2H), 6.31 (m, 5H); $^{13}$C NMR (100 MHz, CDCl$_3$) δ 139.24, 129.42, 129.40, 128.90, 128.86, 128.44, 128.19, 128.11, 127.98, 127.34, 127.05, 126.18, 126.11, 126.05, 125.95, 125.86, 119.36, 66.22; HR-MS calcd for C$_{72}$H$_{48}$N$_4$: 969.1783, found: 969.1787; Anal. Calcd for C$_{72}$H$_{48}$N$_4$: C, 89.23, H, 4.99, N, 5.78. found: C, 89.01, H, 5.02, N, 5.97; TLC R$_f$ 0.23 (CH$_2$Cl$_2$/hexane, 2/1).

Data for the obtained Compound 17 are shown as follows: m.p. 266.17° C. (DSC); M.W.: 744.33; $^1$H NMR (400 MHz, CDCl$_3$) δ 8.30 (d, J=8.3, 1H), 7.68 (d, J=7.5, 2H), 7.50 (s, 2H), 7.29 (m, 7H), 7.20 (m, 7H), 7.09 (m, 3H), 6.99 (m, 3H), 6.92 (d, J=8.3, 4H), 6.87 (d, J=8.1, 2H), 6.67 (s, 1H), 6.59 (d, J=8.6, 1H), 6.37 (d, J=8.5, 1H), 3.11 (s, 3H), 2.97 (d, J=6.8, 3H); $^{13}$C NMR (100 MHz, CDCl$_3$) δ 148.72, 148.14, 147.62, 142.33, 139.79, 129.82, 129.59, 129.47, 129.21, 128.96, 128.48, 128.26, 128.07, 128.00, 127.70, 126.90, 123.17, 122.83, 121.07, 120.58, 120.03, 118.64, 114.91, 66.88 39.93, 39.69; HR-MS calcd for C$_{54}$H$_{40}$N$_4$: 744.3253, found: 744.3259; Anal. Calcd for C$_{54}$H$_{40}$N$_4$: C, 87.07, H, 5.41, N, 7.52 found: C, 86.80, H, 5.36, N, 7.84; TLC R$_f$ 0.42 (CH$_2$Cl$_2$/hexane, 2/1).

The data for the glass transition temperature (T$_g$), decomposition temperature (T$_d$), the longest peak wavelength value of the absorption spectrum (λ$_{max}$), and the longest peak wavelength value of the photoluminescence spectrum (PL_λ$_{max}$) of Compounds 15-17 were measured and are recorded in the following Table 1. From Table 1, it is easy to see that these 1,2-diphenylimidazole-fused, spirally-configured cis-stilbene/fluorene derivatives proposed in the present invention have glass transition temperatures (T$_g$) that range from 143° C. to 185° C. and decomposition temperatures (T$_d$) that range from 429° C. to 474° C. This means that these 1,2-diphenylimidazole-fused, spirally-configured cis-stilbene/fluorene derivatives possess excellent thermal stability, and will not easily decompose under high voltage or high current density operating conditions. In Table 1, Φ represents a phenyl group, N represents nitrogen, BS represents the imidazole-fused spirally configured cis-stilbene/fluorene structure, Np represents naphthyl, and Me represents methyl.

TABLE 1

| Group | $T_g$ (° C.) | $T_d$ (° C.) | $\lambda_{max}$ (nm) | PL $\lambda_{max}$ (nm) |
|---|---|---|---|---|
| Compound 15 ($\Phi_2$NBSN$\Phi_2$) | 185 | 463 | 372 | 435 |
| Compound 16 (Np$\Phi$NBSN$\Phi$Np) | 180 | 474 | 368 | 436 |

TABLE 1-continued

| Group | $T_g$ (° C.) | $T_d$ (° C.) | $\lambda_{max}$ (nm) | PL $\lambda_{max}$ (nm) |
|---|---|---|---|---|
| Compound 17 (Me$\Phi$NBSN$\Phi$Me) | 143 | 429 | 364 | 434 |

Moreover, the oxidation potential and the redox potential of Compounds 15-17 of these 1,2-diphenylimidazole-fused, spirally-configured cis-stilbene/fluorene derivatives can be measured using cyclic voltammetry (CV). In Table 2, $E_{1/2ox}$ and $E_{1/2red}$ of the 1,2-diphenylimidazole-fused, spirally-configured cis-stilbene/fluorene derivatives are recorded. From Table 2, a skilled person in the art of OLED materials can see that these 1,2-diphenylimidazole-fused, spirally-configured cis-stilbene/fluorene derivatives proposed in the present invention have a first oxidation potential that ranges from 0.13 V to 0.30 V and a second oxidation potential that ranges from 0.39 V to 0.57 V for Compounds 15-17.

TABLE 2

| Group | $E_{1/2}^{ox}$ (V) | $E_{1/2}^{red}$ (V) |
|---|---|---|
| Compound 15 ($\Phi_2$NBSN$\Phi_2$) | 0.28/0.51 | — |
| Compound 16 (Np$\Phi$NBSN$\Phi$Np) | 0.30/0.57 | — |
| Compound 17 (Me$\Phi$NBSN$\Phi$Me) | 0.13/0.39 | — |

A process for manufacturing an OLED device according to the present invention is described as follows. An aluminum substrate is cleaned by detergent. The cleaned aluminum substrate is loaded into a evaporation machine in a vacuum environment of about $7 \times 10^{-6}$ torr to coat the cleaned aluminum substrate with various organic materials and metals listed in the following Table 3. The evaporation machine is purged with nitrogen and the coated substrate is removed for evaluation. Alternatively, an ITO glass can also be used to manufacture the OLED device. The ITO glass is cleaned and put into an evaporation machine. The various organic materials and metals can be deposited onto the ITO glass in a reverse sequence, to obtain the OLED device.

In order to prove that these proposed 1,2-diphenylimidazole-fused, spirally-configured cis-stilbene/fluorene hybrid materials can indeed be applied in OLEDs as a hole-transport layer and/or an emitting layer, a plurality of OLED devices for control groups and experiment groups were designed and manufactured, wherein the constituting layers for the OLED devices are shown in the following Table 3.

TABLE 3

| Device Group | Substrate | bottom electrode | electron transport layer | hole blocking layer | emitting layer, blue dopant | emitting layer, blue host | hole transport layer | hole injection layer | top electrode |
|---|---|---|---|---|---|---|---|---|---|
| Experiment 1 | Al | LiF | Alq3 | BCP | Compound 15 ($\Phi_2$NBSN$\Phi_2$) | Compound 15 ($\Phi_2$NBSN$\Phi_2$) | NPB | HATCN | ITO |
| Experiment 2 | Al | LiF | Alq3 | BCP | Compound 16 (Np$\Phi$NBSN$\Phi$Np) | Compound 16 (Np$\Phi$NBSN$\Phi$Np) | NPB | HATCN | ITO |
| Experiment 3 | Al | LiF | Alq3 | BCP | Compound 17 (Me$\Phi$NBSN$\Phi$Me) | Compound 17 (Me$\Phi$NBSN$\Phi$Me) | NPB | HATCN | ITO |
| Control 1 | Al | LiF | Alq3 | BCP | spirofluorene | spirofluorene | NPB | HATCN | ITO |
| Experiment 4 | Al | LiF | Alq3 | BCP | Compound 16 (Np$\Phi$NBSN$\Phi$Np) | BANE | NPB/TAPC | HATCN | ITO |
| Control 2 | Al | LiF | Alq3 | BCP | spirofluorene | BANE | NPB/TAPC | HATCN | ITO |

In Table 3, Alq3 is the abbreviation of tris-(8-hydroxyquinoline)aluminum, BCP is the abbreviation of 2,9-dimethyl-4,7-diphenyl-1,10-phenanthroline, BANE is the abbreviation of 10,10'-di(biphenyl-4-yl)-9,9'-bianthracene, and NPB is the abbreviation of N,N'-di(1-naphthyl)-N,N'-diphenyl-(1,1'-biphenyl)-4,4'-diamine. In addition, spirofluorene is represented by Formula 18, TAPC is 4,4'-cyclohexylidenebis[N,N-bis(4-methylphenyl)benzenamine] represented by Formula 19, and HATCN is 1,4,5,8,9,11-hexaazatriphenylene hexacarbonitrile represented by Formula 20.

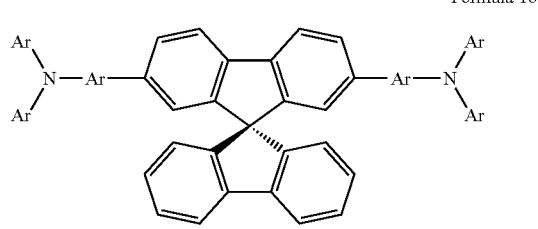

Formula 18

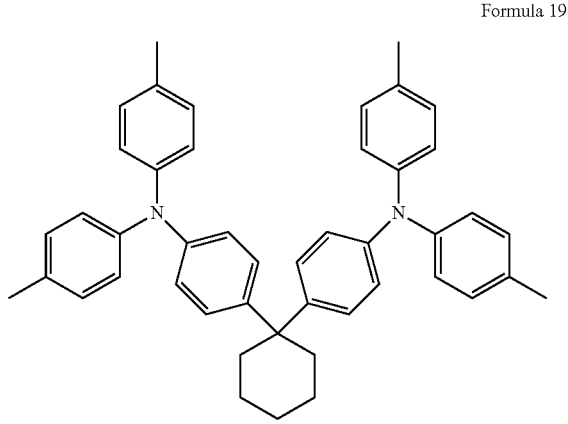

Formula 19

-continued

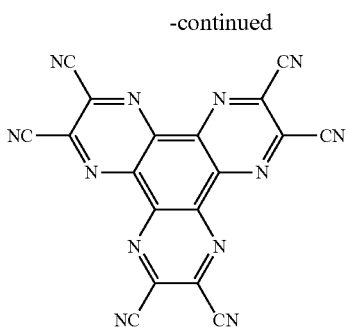

Formula 20

The turn-on voltage ($V_{on}$), the external quantum efficiency ($\eta_{ext}$), the current efficiency ($\eta_c$), the power efficiency ($\eta_p$), and the maximum luminance ($L_{max}$) of the OLED devices were measured and are recorded in Table 4.

TABLE 4

| Device Group | $\lambda_{max}$ (nm) | $V_{on}$ (V) | $\eta_{ext}$ (%) | $\eta_c$ (cd/A) | $\eta_p$ (lm/w) | $L_{max}$ (cd/m$^2$) |
|---|---|---|---|---|---|---|
| Experiment 1 | 450 | 3.2 | 2.5 | 2.2 | 1.0 | 6266 |
| Experiment 2 | 450 | 3.2 | 2.8 | 2.5 | 1.3 | 6530 |
| Experiment 3 | 450 | 3.0 | 2.9 | 2.3 | 1.1 | 7344 |
| Control 1 | 450 | 3.5 | 2.0 | 2.0 | 0.8 | 5256 |
| Experiment 4 | 450 | 3.2 | 6.0 | 7.5 | 6.8 | 10120 |
| Control 2 | 450 | 3.6 | 4.5 | 5.0 | 4.3 | 9898 |

With reference to the measured data of the blue fluorescent OLED devices in Table 4, one can find that the OLED devices using a single hole transport layer from Experiments 1-3 show excellent $\eta_{ext}$, $\eta_c$, $\eta_p$, and $L_{max}$, and are much superior to OLED devices with a single dopant emitting layer of Control 1. Among them, Experiment 2 using NpΦNBSNΦNp shows the best results, where the $\eta_{ext}$ is 2.8%, $\eta_c$ is 2.5 cd/A, $\eta_p$ is 1.3 lm/w, and $L_{max}$ is 6530 cd/m$^2$.

In addition, the measured data also reveal that the OLED devices using a single dopant emitting layer in Experiment 4 shows excellent $\eta_{ext}$, $\eta_c$, $\eta_p$, and $L_{max}$, which are superior to the OLED devices using a single dopant emitting layer of Control 1. Moreover, the OLED device using a single dopant emitting layer in Experiment 4 also shows excellent $\eta_{ext}$, $\eta_c$, $\eta_p$, and $L_{max}$, which is superior to the OLED devices with a single dopant emitting layer of Control 2.

Furthermore, device life time evaluation tests for the blue fluorescent OLEDs were also completed based on a starting luminance of 1,000 cd/cm$^2$. The life time evaluation test results reveal that the decay half lifetimes ($LT_{50}$) of the green phosphorescent OLED in Experiment 4 is 930 hours. In addition, the decay half lifetime ($LT_{50}$) for the blue fluorescent OLEDs of Control 2 was measured as 902 hours.

Through the above descriptions, the imidazole-fused, spirally-configured cis-stilbene/fluorene derivatives for OLEDs proposed in the present invention have been introduced completely and clearly. In summary, the present invention includes the advantages of:

(1) The imidazole-fused, spirally-configured cis-stilbene/fluorene hybrid materials are imidazole-fused, spirally-configured cis-stilbene/fluorene derivatives with glass transition temperatures that range from 143° C. to 185° C., and decomposition temperatures that range from 429° C. to 474° C.

(2) In addition, a variety of experimental data prove that these imidazole-fused, spirally-configured cis-stilbene/fluorene derivatives can indeed be used as a host material for the light emitting layer, a dopant for the light emitting layer, or a hole-transport type emitting layer for OLEDs. Moreover, the experimental data also reveal that OLEDs using these imidazole-fused, spirally-configured cis-stilbene/fluorene derivatives used as the host material for the light emitting layer, the dopant for the light emitting layer, or the hole-transport type emitting layer show good to excellent external quantum efficiency ($\eta_{ext}$), current efficiency ($\eta_c$), power efficiency ($\eta_p$), maximum luminance ($L_{max}$), and device lifetime performance better than conventional or commercial OLEDs.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An organic compound comprising:
   a electron donating 4,4'-substituted cis-stilbene segment;
   a bridge atom segment having a bridge atom with four bonds, and the bridge atom is connected to the electron donating 4,4'-substituted cis-stilbene segment with two of the four bonds to form a 7-membered ring structure; and
   an imidazole segment connected to the electron donating 4,4'-substituted cis-stilbene segment.

2. An organic compound according to claim 1, wherein the imidazole segment has an aromatic group substituting a hydrogen connecting to one of a nitrogen and a carbon on the imidazole segment; wherein
   the aromatic group is a phenyl group,
   when each of the hydrogen connecting to the nitrogen and the hydrogen connecting to the carbon is substituted with the phenyl group, the imidazole segment is a 1,2-diphenyl imidazole segment, and the 1,2-diphenyl imidazole segment is represented by Formula 1a:

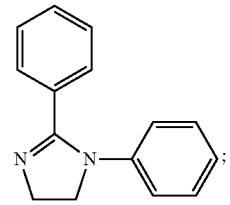

Formula 1a when the hydrogen connecting to the carbon is substituted with the phenyl group, the imidazole segment is a 2-phenyl imidazole segment, and the 2-phenyl imidazole segment is represented by Formula 1b:

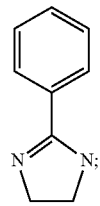

Formula 1b and when the hydrogen connecting to the nitrogen is substituted with the phenyl group, the imidazole segment is a 1-phenyl imidazole segment, and the 1-phenyl imidazole segment is represented by Formula 1c:

Formula 1c

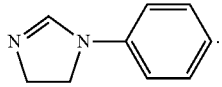

3. An organic compound according to claim 1, wherein the electron donating 4,4'-substituted cis-stilbene segment is represented by Formula 2:

Formula 2

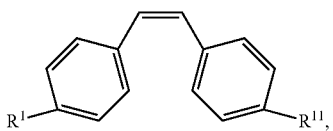

wherein each of $R^1$ and $R^{11}$ is one selected from a group consisting of halogen, —Ar, an aromatic amino group, Formulae 3a and 3b:

Formula 3a

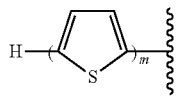

Formula 3b

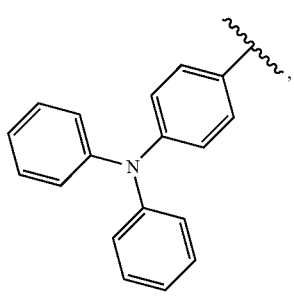

wherein the halogen is one selected from a group consisting of F, Cl, Br and I, Ar is phenyl, the aromatic amino group is —$NR^4R^5$, wherein either of $R^4$ and $R^5$ is one selected from a group consisting of H and phenyl and naphthyl, and m is an integer of 1-3.

4. A compound according to claim 3, wherein —$NR^4R^5$ is represented by one of Formulae 3m, 3n and 3p:

Formula 3m

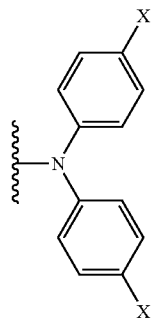

Formula 3n

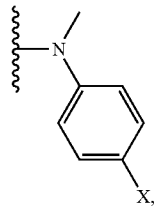

Formula 3p

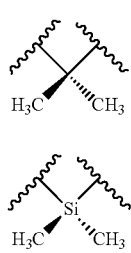

wherein X is one of H and a substituted or unsubstituted alkyl having 1 to 20 carbon atoms.

5. A compound according to claim 1, wherein the bridge atom is one of carbon and silicon, and the bridge atom segment is one selected from a group consisting of Formulae A1, A2, A3 and A4:

Formula A1

Formula A2

Formula A3

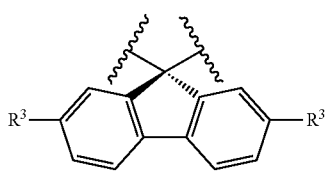

-continued

Formula A4

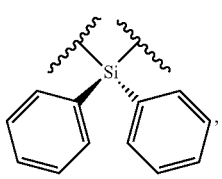

wherein R³ is one selected from a group consisting of H, tert-butyl and naphthyl.

6. A compound according to claim 1, wherein the compound features one selected from a group consisting of a glass transition temperature (T$_g$) ranging from 143° C. to 185° C., a decomposition temperature (Ta) ranging from 429° C. to 474° C., a first oxidation potential ranging from 0.13V to 0.30V, a second oxidation potential ranging from 0.39 V to 0.57 V and a combination thereof.

7. A compound according to claim 1, wherein the compound is one represented by one selected from a group consisting of Formula 4A, Formula 4B and Formula 4C:

Formula 4A

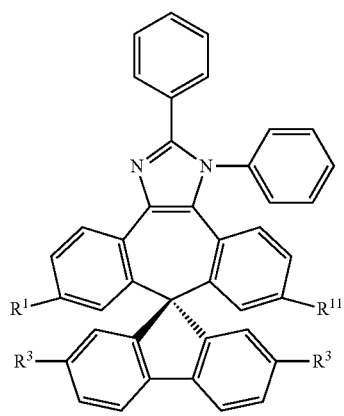

Formula 4B

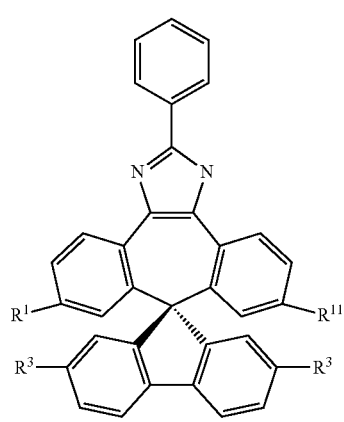

Formula 4C

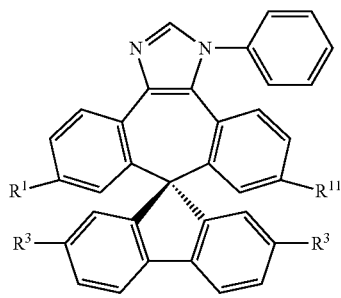

wherein each of R¹ and R¹¹ is one selected from a group consisting of Ar, an aromatic thiophene and an amino group, and R³ is one selected from a group consisting of H, tert-butyl and naphthyl.

8. A compound according to claim 1, wherein the compound is applied to a material selected from a group consisting of an electron transport layer, a light-emitting layer, and a combination thereof in an organic light emitting diode (OLED).

9. An electronic device made using a compound, the compound comprising:

an electron donating 4,4'-substituted cis-stilbene segment;

a bridge atom segment having a bridge atom with four bonds, and the bridge atom is connected to the electron donating 4,4'-substituted cis-stilbene segment with two of the four bonds to form a 7-membered ring structure; and an imidazole segment connected to the electron donating 4,4'-substituted cis-stilbene segment.

10. An electronic device according to claim 9, wherein the imidazole segment has an aromatic group substituting a hydrogen connecting to one of a nitrogen and a carbon on the imidazole segment; wherein the aromatic group is a phenyl group, when each of the hydrogen connecting to the nitrogen and the hydrogen connecting to the carbon is substituted with the phenyl group, the imidazole segment is a 1,2-diphenyl imidazole segment, and the 1,2-diphenyl imidazole segment is represented by Formula 1a:

Formula 1a

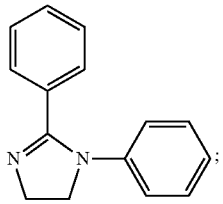

when the hydrogen connecting to the carbon is substituted with the phenyl group, the imidazole segment is a 2-phenyl imidazole segment, and the 2-phenyl imidazole segment is represented by Formula 1b:

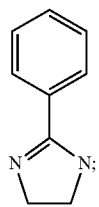

Formula 1b and when the hydrogen connecting to the nitrogen is substituted with the phenyl group, the imidazole segment is a 1-phenyl imidazole segment, and the 1-phenyl imidazole segment is represented by Formula 1c:

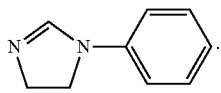

Formula 1c

11. An electronic device according to claim 9, wherein the electron donating 4,4'-substituted cis-stilbene segment is represented by Formula 2:

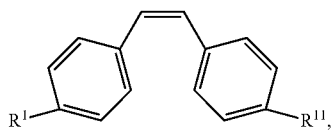

Formula 2 wherein $R^1$ and $R^{11}$ is one selected from a group consisting of halogen, —Ar, an aromatic amino group, Formulae 3a and 3b:

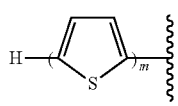

Formula 3a

Formula 3b

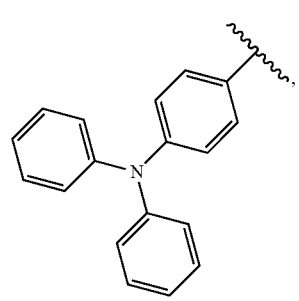

wherein the halogen is one selected from a group consisting of F, Cl, Br and I, Ar is phenyl, the aromatic amino group is —NR$^4$R$^5$, wherein either of R$^4$ and R$^5$ is one selected from a group consisting of H and phenyl and naphthyl, and m is an integer of 1-3.

12. An electronic device according to claim 11, wherein —NR$^4$R$^5$ is represented by one of Formulae 3m, 3n and 3p:

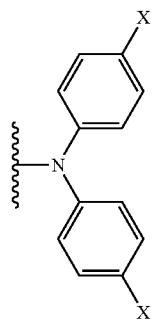

Formula 3m

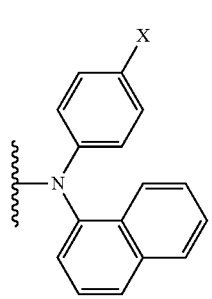

Formula 3n

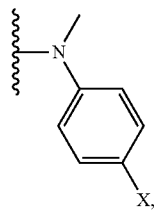

Formula 3p wherein X is one of H and a substituted or unsubstituted alkyl having 1 to 20 carbon atoms.

13. An electronic device according to claim 9, wherein the bridge atom is one of carbon and silicon, and the bridge atom segment is one selected from a group consisting of Formulae A1, A2, A3 and A4:

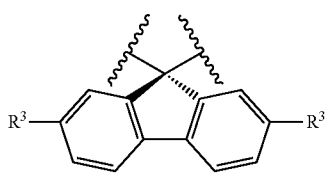

Formula A1

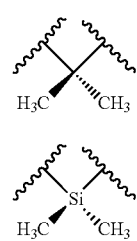

Formula A2

Formula A3

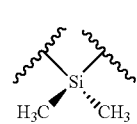

Formula A4

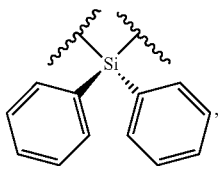

wherein R³ is one selected from a group consisting of H, tert-butyl and naphthyl.

14. An electronic device according to claim 9, wherein the compound features one selected from a group consisting of a glass transition temperature (T$_g$) ranging from 143° C. to 185° C., a decomposition temperature (Ta) ranging from 429° C. to 474° C., a first oxidation potential ranging from 0.13V to 0.30V, a second oxidation potential ranging from 0.39 V to 0.57 V, and a combination thereof.

15. An electronic device according to claim 9, wherein the electronic device is an organic light emitting diode (OLED), and the compound is applied to one selected from a group consisting of a host material in a light-emitting layer, a dopant in a light-emitting layer, and a hole-transport type emitting layer in the OLED.

16. An electronic device according to claim 9, comprising:
a first electrode;
an organic layer; and
a second electrode connected to the hole transport layer, wherein the organic layer is made using the compound.

17. An electronic device according to claim 16, wherein the organic layer includes one selected from a group consisting of a hole transport layer, an light emitting layer, and a combination thereof.

18. An electronic device according to claim 17, wherein the hole transport layer and the light emitting layer are formed as a single layer.

19. An electronic device according to claim 17, further comprising a hole blocking layer disposed between the light emitting layer and the electron transport layer, and wherein the first electrode is a cathode, and the second electrode is an anode.

20. An electronic device according to claim 9, wherein the electronic device is applied to one selected from a group consisting of an organic light emitting apparatus, a solar cell apparatus, an organic transistor, a detection apparatus, a computer monitor, a TV, a billboard, a light for interior or exterior illumination, a signaling light for interior or exterior illumination, a flexible display, a laser printer, a telephone, a cell phone, a remote control apparatus, a pad computer, a laptop computer, a digital camera, a camcorder, a viewfinder, a micro-display, a vehicle electronic apparatus, a large area wall display, a theater screen, a stadium screen, a signaling apparatus, a personal digital assistant (PDA), a laptop computer, an industrial computer, a point of sales (POS), a heads-up display, a fully transparent display, and a touch display.

* * * * *